US011409023B2

(12) United States Patent
Bi et al.

(10) Patent No.: US 11,409,023 B2
(45) Date of Patent: Aug. 9, 2022

(54) METHODS TO HANDLE DISCONTINUITY IN CONSTRUCTING DESIGN SPACE USING MOVING LEAST SQUARES (71) Applicants: Linfeng Bi, Houston, TX (US); Xiaohui Wu, Sugar Land, TX (US); Larisa Branets, Conroe, TX (US)

(72) Inventors: Linfeng Bi, Houston, TX (US); Xiaohui Wu, Sugar Land, TX (US); Larisa Branets, Conroe, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 833 days.

(21) Appl. No.: 14/868,548

(22) Filed: Sep. 29, 2015

(65) Prior Publication Data
US 2016/0124113 A1 May 5, 2016

Related U.S. Application Data (60) Provisional application No. 62/073,465, filed on Oct. 31, 2014.

(51) Int. Cl.
*G06T 17/05* (2011.01)
*G01V 99/00* (2009.01)
*G06F 30/20* (2020.01)

(52) U.S. Cl.
CPC ............ *G01V 99/005* (2013.01); *G06F 30/20* (2020.01); *G06T 17/05* (2013.01); *G01V 2210/66* (2013.01)

(58) Field of Classification Search
CPC .. G01V 99/005; G01V 2210/66; G06T 17/05; G06F 17/5009
See application file for complete search history.

(56) References Cited

U.S. PATENT DOCUMENTS

| 5,537,320 A | 7/1996 | Simpson et al. |
| 5,671,136 A | 9/1997 | Willhoit, Jr. |
| 5,706,194 A | 1/1998 | Neff et al. |

(Continued)

FOREIGN PATENT DOCUMENTS

| EP | 1653411 | 10/2004 |
| EP | 1707993 | 3/2005 |

(Continued)

OTHER PUBLICATIONS

U.S. Appl. No. 62/081,159, filed Nov. 18, 2014, Branets, et al.

(Continued)

*Primary Examiner* — Khamdan N. Alrobaie (74) *Attorney, Agent, or Firm* — Leandro Arechederra, III (57) ABSTRACT Method for constructing a continuous design space for generating a physical property model in a faulted subsurface medium. The matching relationship of the fault traces on the two sides of each fault is used in a systematic way to determine the location of the fault traces in the design space. The location of any other point in the design space may then be determined by interpolation of the locations of fault traces. The fault traces are thus used as control points for the mapping. The method involves: (a) identifying the control points and determining their location in both physical and design space and (b) using selected control points, mapping any point from physical space to design space, preferably using the moving least squares method.

7 Claims, 6 Drawing Sheets

(56) References Cited

U.S. PATENT DOCUMENTS

| | | |
|---|---|---|
| 5,710,726 A | 1/1998 | Rowney et al. |
| 5,747,673 A | 5/1998 | Ungerer et al. |
| 5,838,634 A | 11/1998 | Jones et al. |
| 5,844,799 A | 12/1998 | Joseph et al. |
| 5,953,680 A | 9/1999 | Divies et al. |
| 5,992,519 A | 11/1999 | Ramakrishnan et al. |
| 6,018,498 A | 1/2000 | Neff et al. |
| 6,052,529 A | 4/2000 | Watts, III |
| 6,106,561 A | 8/2000 | Farmer |
| 6,128,577 A | 10/2000 | Assa et al. |
| 6,128,579 A | 10/2000 | McCormack et al. |
| 6,138,076 A * | 10/2000 | Graf ................. G01V 1/28 367/73 |
| 6,230,101 B1 | 5/2001 | Wallis |
| 6,374,185 B1 | 4/2002 | Taner et al. |
| 6,480,790 B1 | 11/2002 | Calvert et al. |
| 6,549,854 B1 | 4/2003 | Malinverno et al. |
| 6,597,995 B1 | 7/2003 | Cornu et al. |
| 6,662,146 B1 | 12/2003 | Watts |
| 6,664,961 B2 | 12/2003 | Ray et al. |
| 6,823,296 B2 | 11/2004 | Rey-Fabret et al. |
| 6,823,297 B2 | 11/2004 | Jenny et al. |
| 6,826,483 B1 | 11/2004 | Anderson et al. |
| 6,826,520 B1 | 11/2004 | Khan et al. |
| 6,826,521 B1 | 11/2004 | Hess et al. |
| 6,839,632 B2 | 1/2005 | Grace |
| 6,901,391 B2 | 5/2005 | Storm, Jr. et al. |
| 6,940,507 B2 | 9/2005 | Repin et al. |
| 6,980,940 B1 | 12/2005 | Gurpinar et al. |
| 6,987,878 B2 | 1/2006 | Lees et al. |
| 7,043,367 B2 | 5/2006 | Granjeon |
| 7,069,149 B2 | 6/2006 | Goff et al. |
| 7,089,166 B2 | 8/2006 | Malthe-Sorenssen et al. |
| 7,096,122 B2 | 8/2006 | Han |
| 7,096,172 B2 | 8/2006 | Colvin et al. |
| 7,177,787 B2 | 2/2007 | Rey-Fabret et al. |
| 7,191,071 B2 | 3/2007 | Kfoury et al. |
| 7,254,091 B1 | 8/2007 | Gunning et al. |
| 7,277,796 B2 | 10/2007 | Kuchuk et al. |
| 7,280,952 B2 | 10/2007 | Butler et al. |
| 7,286,972 B2 | 10/2007 | Maker |
| 7,363,163 B2 | 4/2008 | Valec-Dupin et al. |
| 7,369,980 B2 | 5/2008 | Deffenbaugh et al. |
| 7,376,539 B2 | 5/2008 | Lecomte |
| 7,379,853 B2 | 5/2008 | Middya |
| 7,379,854 B2 | 5/2008 | Calvert et al. |
| 7,406,878 B2 | 8/2008 | Rieder et al. |
| 7,412,363 B2 | 8/2008 | Callegari |
| 7,415,401 B2 | 8/2008 | Calvert et al. |
| 7,424,415 B2 | 9/2008 | Vassilev |
| 7,433,786 B2 | 10/2008 | Adams |
| 7,451,066 B2 | 11/2008 | Edwards et al. |
| 7,467,044 B2 | 12/2008 | Tran et al. |
| 7,478,024 B2 | 1/2009 | Gurpinar et al. |
| 7,480,205 B2 | 1/2009 | Wei |
| 7,486,589 B2 | 2/2009 | Lee et al. |
| 7,516,056 B2 | 4/2009 | Wallis et al. |
| 7,523,024 B2 | 4/2009 | Endres et al. |
| 7,526,418 B2 | 4/2009 | Pita et al. |
| 7,539,625 B2 | 5/2009 | Klumpen et al. |
| 7,542,037 B2 | 6/2009 | Fremming |
| 7,546,229 B2 | 6/2009 | Jenny et al. |
| 7,548,840 B2 | 6/2009 | Saaf |
| 7,577,527 B2 | 8/2009 | Velasquez |
| 7,584,081 B2 | 9/2009 | Wen et al. |
| 7,596,056 B2 | 9/2009 | Keskes et al. |
| 7,596,480 B2 | 9/2009 | Fung et al. |
| 7,603,265 B2 | 10/2009 | Mainguy et al. |
| 7,606,691 B2 | 10/2009 | Calvert et al. |
| 7,617,082 B2 | 11/2009 | Childs et al. |
| 7,620,800 B2 | 11/2009 | Huppenthal et al. |
| 7,640,149 B2 | 12/2009 | Rowan et al. |
| 7,657,494 B2 | 2/2010 | Wilkinson et al. |
| 7,672,825 B2 | 3/2010 | Brouwer et al. |
| 7,684,929 B2 | 3/2010 | Prange et al. |
| 7,706,981 B2 | 4/2010 | Wilkinson et al. |
| 7,711,532 B2 | 5/2010 | Dulac et al. |
| 7,716,029 B2 | 5/2010 | Couet et al. |
| 7,771,532 B2 | 5/2010 | Dulac et al. |
| 7,739,089 B2 | 6/2010 | Gurpinar et al. |
| 7,752,023 B2 | 7/2010 | Middya |
| 7,756,694 B2 | 7/2010 | Graf et al. |
| 7,783,462 B2 | 8/2010 | Landis, Jr. et al. |
| 7,796,469 B2 | 9/2010 | Keskes et al. |
| 7,809,537 B2 | 10/2010 | Hemanthkumar et al. |
| 7,809,538 B2 | 10/2010 | Thomas |
| 7,822,554 B2 | 10/2010 | Zuo et al. |
| 7,844,430 B2 | 11/2010 | Landis, Jr. et al. |
| 7,860,654 B2 | 12/2010 | Stone |
| 7,869,954 B2 | 1/2011 | Den Boer et al. |
| 7,877,246 B2 | 1/2011 | Moncorge et al. |
| 7,878,268 B2 | 2/2011 | Chapman et al. |
| 7,920,970 B2 | 4/2011 | Zuo et al. |
| 7,925,481 B2 | 4/2011 | Van Wagoner et al. |
| 7,932,904 B2 | 4/2011 | Branets et al. |
| 7,933,750 B2 | 4/2011 | Morton et al. |
| 7,953,585 B2 | 5/2011 | Gurpinar et al. |
| 7,970,593 B2 | 6/2011 | Roggero et al. |
| 7,986,319 B2 | 7/2011 | Dommisse |
| 7,991,660 B2 | 8/2011 | Callegari |
| 7,996,154 B2 | 8/2011 | Zuo et al. |
| 8,005,658 B2 | 8/2011 | Tilke et al. |
| 8,050,892 B2 | 11/2011 | Hartman |
| 8,078,437 B2 | 12/2011 | Wu et al. |
| 8,095,345 B2 | 1/2012 | Hoversten |
| 8,095,349 B2 | 1/2012 | Kelkar et al. |
| 8,145,464 B2 | 3/2012 | Arengaard et al. |
| 8,190,405 B2 | 5/2012 | Appleyard |
| 8,204,726 B2 | 6/2012 | Lee et al. |
| 8,204,727 B2 | 6/2012 | Dean et al. |
| 8,209,202 B2 | 6/2012 | Narayanan et al. |
| 8,212,814 B2 | 7/2012 | Branets et al. |
| 8,249,842 B2 | 8/2012 | Ghorayeb et al. |
| 8,255,195 B2 | 8/2012 | Yogeswaren |
| 8,271,248 B2 | 9/2012 | Pomerantz et al. |
| 8,275,589 B2 | 9/2012 | Montaron et al. |
| 8,275,593 B2 | 9/2012 | Zhao |
| 8,280,635 B2 | 10/2012 | Ella et al. |
| 8,280,709 B2 | 10/2012 | Koutsabeloulis et al. |
| 8,285,532 B2 | 10/2012 | Zangl et al. |
| 8,301,426 B2 | 10/2012 | Abasov et al. |
| 8,301,429 B2 | 10/2012 | Hajibeygi et al. |
| 8,315,845 B2 | 11/2012 | Lepage |
| 8,335,677 B2 | 12/2012 | Yeten et al. |
| 8,339,395 B2 | 12/2012 | Williams et al. |
| 8,350,851 B2 | 1/2013 | Flew et al. |
| 8,359,184 B2 | 1/2013 | Massonnat |
| 8,359,185 B2 | 1/2013 | Pita et al. |
| 8,374,974 B2 | 2/2013 | Chen et al. |
| 8,386,227 B2 | 2/2013 | Fung et al. |
| 8,401,832 B2 | 3/2013 | Ghorayeb et al. |
| 8,412,501 B2 | 4/2013 | Oury et al. |
| 8,412,502 B2 | 4/2013 | Moncorge et al. |
| 8,423,338 B2 | 4/2013 | Ding et al. |
| 8,428,919 B2 | 4/2013 | Parashkevov |
| 8,429,671 B2 | 4/2013 | Wood et al. |
| 8,433,551 B2 | 4/2013 | Fung et al. |
| 8,437,999 B2 | 5/2013 | Pita et al. |
| 8,447,525 B2 | 5/2013 | Pepper |
| 8,452,580 B2 | 5/2013 | Strebelle |
| 8,457,940 B2 | 6/2013 | Xi et al. |
| 8,463,586 B2 | 6/2013 | Mezghani et al. |
| 8,484,004 B2 | 7/2013 | Schottle et al. |
| 8,489,375 B2 | 7/2013 | Omeragic et al. |
| 8,494,828 B2 | 7/2013 | Wu et al. |
| 8,498,852 B2 | 7/2013 | Xu et al. |
| 8,510,242 B2 | 8/2013 | Al-Fattah |
| 8,515,678 B2 | 8/2013 | Pepper et al. |
| 8,515,720 B2 | 8/2013 | Koutsabeloulis et al. |
| 8,515,721 B2 | 8/2013 | Morton et al. |
| 8,521,496 B2 | 8/2013 | Schottle et al. |
| 8,504,341 B2 | 9/2013 | Cullick et al. |
| 8,532,967 B2 | 9/2013 | Torrens et al. |
| 8,532,969 B2 | 9/2013 | Li et al. |

(56) References Cited

U.S. PATENT DOCUMENTS

| | | |
|---|---|---|
| 8,543,364 B2 | 9/2013 | Liu et al. |
| 8,577,660 B2 | 11/2013 | Wendt et al. |
| 8,583,411 B2 | 11/2013 | Fung |
| 8,589,135 B2 | 11/2013 | Middya et al. |
| 8,599,643 B2 | 12/2013 | Pepper et al. |
| 8,606,524 B2 | 12/2013 | Soliman et al. |
| 8,612,194 B2 | 12/2013 | Horne et al. |
| 8,630,831 B2 | 1/2014 | Bratvedt et al. |
| 8,635,026 B2 | 1/2014 | Ameen |
| 8,639,444 B2 | 1/2014 | Pepper et al. |
| 8,655,632 B2 | 2/2014 | Moguchaya |
| 8,674,984 B2 | 3/2014 | Ran et al. |
| 8,676,557 B2 | 3/2014 | Ding et al. |
| 8,686,996 B2 | 4/2014 | Cheung et al. |
| 8,688,424 B2 | 4/2014 | Bourbiaux et al. |
| 8,694,261 B1 | 4/2014 | Robinson |
| 8,700,549 B2 | 4/2014 | Hossain et al. |
| 8,711,140 B1* | 4/2014 | Mallet ............... G01V 99/005 345/419 |
| 8,712,746 B2 | 4/2014 | Tillier et al. |
| 8,712,747 B2 | 4/2014 | Cullick et al. |
| 8,718,958 B2 | 5/2014 | Breton et al. |
| 8,718,993 B2 | 5/2014 | Klie |
| 8,731,887 B2 | 5/2014 | Hilliard et al. |
| 8,731,891 B2 | 5/2014 | Sung et al. |
| 8,738,294 B2 | 5/2014 | Ameen |
| 8,743,115 B1* | 6/2014 | Mallet ................ G01V 1/302 345/419 |
| 8,762,442 B2 | 6/2014 | Jeong et al. |
| 8,775,141 B2 | 7/2014 | Raphael |
| 8,775,144 B2 | 7/2014 | Han et al. |
| 8,776,895 B2 | 7/2014 | Li et al. |
| 8,780,671 B2 | 7/2014 | Sayers |
| 8,793,111 B2 | 7/2014 | Tilke et al. |
| 8,797,319 B2 | 8/2014 | Lin |
| 8,798,974 B1 | 8/2014 | Nunns |
| 8,798,977 B2 | 8/2014 | Hajibeygi et al. |
| 8,803,878 B2 | 8/2014 | Andersen et al. |
| 8,805,660 B2 | 8/2014 | Güyagüler et al. |
| 8,812,334 B2 | 8/2014 | Givens et al. |
| 8,818,778 B2 | 8/2014 | Salazar-Tio et al. |
| 8,818,780 B2 | 8/2014 | Calvert et al. |
| 8,843,353 B2 | 9/2014 | Posamentier et al. |
| 8,855,986 B2 | 10/2014 | Castellini et al. |
| 8,862,450 B2 | 10/2014 | Derfoul et al. |
| 8,874,804 B2 | 10/2014 | AlShaikh et al. |
| 8,898,017 B2 | 11/2014 | Kragas et al. |
| 8,903,694 B2 | 12/2014 | Wallis et al. |
| 8,935,141 B2 | 1/2015 | Ran et al. |
| 9,759,826 B2* | 9/2017 | Mallet ................ G01V 1/302 |
| 2002/0049575 A1 | 4/2002 | Jalali et al. |
| 2003/0023383 A1* | 1/2003 | Stark ................ G01V 1/28 702/14 |
| 2005/0171700 A1 | 8/2005 | Dean |
| 2006/0122780 A1 | 6/2006 | Cohen et al. |
| 2006/0269139 A1 | 11/2006 | Keskes et al. |
| 2007/0016389 A1 | 1/2007 | Ozgen |
| 2007/0277115 A1 | 11/2007 | Glinsky et al. |
| 2007/0279429 A1 | 12/2007 | Ganzer et al. |
| 2008/0021684 A1* | 1/2008 | Dulac ................ G01V 11/00 703/9 |
| 2008/0126168 A1 | 5/2008 | Carney et al. |
| 2008/0133550 A1 | 6/2008 | Orangi et al. |
| 2008/0144903 A1 | 6/2008 | Wang et al. |
| 2008/0234988 A1 | 9/2008 | Chen et al. |
| 2008/0306803 A1 | 12/2008 | Vaal et al. |
| 2009/0071239 A1 | 3/2009 | Rojas et al. |
| 2009/0122061 A1 | 5/2009 | Hammon, III |
| 2009/0248373 A1 | 10/2009 | Druskin et al. |
| 2010/0132450 A1 | 6/2010 | Pomerantz et al. |
| 2010/0138196 A1 | 6/2010 | Hui et al. |
| 2010/0161300 A1 | 6/2010 | Yeten et al. |
| 2010/0179797 A1 | 7/2010 | Cullick et al. |
| 2010/0185428 A1 | 7/2010 | Vink |
| 2010/0191516 A1 | 7/2010 | Benish et al. |
| 2010/0312535 A1 | 12/2010 | Chen et al. |
| 2010/0324873 A1 | 12/2010 | Cameron |
| 2011/0004447 A1 | 1/2011 | Hurley et al. |
| 2011/0015910 A1 | 1/2011 | Ran et al. |
| 2011/0054869 A1 | 3/2011 | Li et al. |
| 2011/0115787 A1 | 5/2011 | Kadlec |
| 2011/0161133 A1 | 6/2011 | Staveley et al. |
| 2011/0310101 A1 | 12/2011 | Prange et al. |
| 2012/0059640 A1 | 3/2012 | Roy et al. |
| 2012/0065951 A1 | 3/2012 | Roy et al. |
| 2012/0143577 A1 | 6/2012 | Szyndel et al. |
| 2012/0158389 A1 | 6/2012 | Wu et al. |
| 2012/0159124 A1 | 6/2012 | Hu et al. |
| 2012/0215512 A1 | 8/2012 | Sarma |
| 2012/0215513 A1 | 8/2012 | Branets et al. |
| 2012/0232799 A1 | 9/2012 | Zuo et al. |
| 2012/0232859 A1 | 9/2012 | Pomerantz et al. |
| 2012/0232861 A1 | 9/2012 | Lu et al. |
| 2012/0232865 A1 | 9/2012 | Maucec et al. |
| 2012/0265512 A1 | 10/2012 | Hu et al. |
| 2012/0271609 A1 | 10/2012 | Laake et al. |
| 2012/0296617 A1 | 11/2012 | Zuo et al. |
| 2013/0035913 A1 | 2/2013 | Mishev et al. |
| 2013/0041633 A1 | 2/2013 | Hoteit |
| 2013/0046524 A1 | 2/2013 | Gathogo et al. |
| 2013/0073268 A1 | 3/2013 | Abacioglu et al. |
| 2013/0085730 A1 | 4/2013 | Shaw et al. |
| 2013/0090907 A1 | 4/2013 | Maliassov |
| 2013/0096890 A1 | 4/2013 | Vanderheyden et al. |
| 2013/0096898 A1 | 4/2013 | Usadi et al. |
| 2013/0096899 A1* | 4/2013 | Usadi ................ G06F 17/5018 703/10 |
| 2013/0096900 A1 | 4/2013 | Usadi et al. |
| 2013/0110484 A1 | 5/2013 | Hu et al. |
| 2013/0112406 A1 | 5/2013 | Zuo et al. |
| 2013/0116993 A1 | 5/2013 | Maliassov |
| 2013/0118736 A1 | 5/2013 | Usadi et al. |
| 2013/0124097 A1 | 5/2013 | Thorne |
| 2013/0124161 A1 | 5/2013 | Poudret et al. |
| 2013/0124173 A1 | 5/2013 | Lu et al. |
| 2013/0138412 A1 | 5/2013 | Shi et al. |
| 2013/0151159 A1 | 6/2013 | Pomerantz et al. |
| 2013/0166264 A1 | 6/2013 | Usadi et al. |
| 2013/0185033 A1 | 7/2013 | Tompkins et al. |
| 2013/0204922 A1 | 8/2013 | El-Bakry et al. |
| 2013/0231907 A1 | 9/2013 | Yang et al. |
| 2013/0231910 A1 | 9/2013 | Kumar et al. |
| 2013/0245949 A1 | 9/2013 | Abitrabi et al. |
| 2013/0246031 A1* | 9/2013 | Wu ................ G06T 17/05 703/10 |
| 2013/0289961 A1 | 10/2013 | Ray et al. |
| 2013/0304679 A1 | 11/2013 | Fleming et al. |
| 2013/0311151 A1 | 11/2013 | Plessix |
| 2013/0312481 A1 | 11/2013 | Pelletier et al. |
| 2013/0332125 A1 | 12/2013 | Suter et al. |
| 2013/0338985 A1 | 12/2013 | Garcia et al. |
| 2014/0012557 A1 | 1/2014 | Tarman et al. |
| 2014/0166280 A1 | 6/2014 | Stone et al. |
| 2014/0201450 A1 | 7/2014 | Haugen |
| 2014/0214388 A1 | 7/2014 | Gorell |
| 2014/0236558 A1 | 8/2014 | Maliassov |
| 2015/0066460 A1* | 3/2015 | Klinger ............ G06F 17/5018 703/2 |
| 2015/0120199 A1 | 4/2015 | Casey |

FOREIGN PATENT DOCUMENTS

| | | |
|---|---|---|
| WO | 1999/028767 | 6/1999 |
| WO | 2007/022289 | 2/2007 |
| WO | 2007/116008 | 10/2007 |
| WO | 2008/008121 | 1/2008 |
| WO | 2009/138290 | 11/2009 |
| WO | 2013/180709 | 12/2013 |
| WO | 2013/184190 | 12/2013 |
| WO | 2013/187915 | 12/2013 |
| WO | 2014/027196 | 2/2014 |
| WO | 2014/051903 | 4/2014 |
| WO | WO 2014/051903 | 4/2014 |

(56) References Cited

FOREIGN PATENT DOCUMENTS

| WO | 2014/171947 | 10/2014 |
|---|---|---|
| WO | 2014/185898 | 11/2014 |
| WO | 2014/185950 | 11/2014 |

OTHER PUBLICATIONS

U.S. Appl. No. 62/073,465, filed Oct. 31, 2014, Bi, et al.
U.S. Appl. No. 62/033,529, filed Aug. 5, 2014, Casey.
U.S. Appl. No. 62/031,097, filed Jul. 30, 2014, Branets, et al.
2D Kinematic Modelling (2014), "World-Leading Forward and Reverse Modelling Tools for Validating Your Interpretation and Reducing Uncertainty", www.mve.com, 2 pgs.
3D Kinematics Modelling (2014), "World-Leading 3D Forward and Reverse Modelling Tools to Help Validate Your Model, and Reduce Uncertainty", www.mve.com, 2 pgs.
Aarnes, J. (2004), "Multiscale simulation of flow in heterogeneous oil-reservoirs", SINTEF ICT, Dept. of Applied Mathematics, 2 pgs.
Aarnes, J. et al. (2004), "Toward reservoir simulation on geological grid models", $9^{th}$ European Conf. on the Mathematics of Oil Recovery, 8 pgs.
Ahmadizadeh, M., et al., (2007), "Combined Implicit or Explicit Integration Steps for Hybrid Simulation", *Structural Engineering Research Frontiers*, pp. 1-16.
Bortoli, L. J., et al., (1992), "Constraining Stochastic Images to Seismic Data", Geostatistics, Troia, *Quantitative Geology and Geostatistics* 1, 325-338.
Byer, T.J., et al., (1998), "Preconditioned Newton Methods for Fully Coupled Reservoir and Surface Facility Models", SPE 49001, 1998 *SPE Annual Tech. Conf., and Exh.*, pp. 181-188.
Candes, E. J., et al., (2004), "New Tight Frames of Curvelets and Optimal Representations of Objects with $C^2$ Singularities," *Communications on Pure and Applied Mathematics* 57, 219-266.
Chen, Y. et al. (2003), "A coupled local-global upscaling approach for simulating flow in highly heterogeneous formations", *Advances in Water Resources* 26, pp. 1041-1060.
Connolly, P., (1999), "Elastic Impedance," *The Leading Edge* 18, 438-452.
Crotti, M.A. (2003), "Upscaling of Relative Permeability Curves for Reservoir Simulation: An Extension to Areal Simulations Based on Realistic Average Water Saturations", SPE 81038, SPE Latin American and Caribbean Petroleum Engineering Conf., 6 pgs.
Donoho, D. L., Hou, X., (2002), "Beamlets and Multiscale Image Analysis," *Multiscale and Multiresolution Methods, Lecture Notes in Computational Science and Engineering* 20, 149-196.
Durlofsky, L.J. (1991), "Numerical Calculation of Equivalent Grid Block Permeability Tensors for Heterogeneous Porous Media", *Water Resources Research* 27(5), pp. 699-708.
Farmer, C.L. (2002), "Upscaling: a review", *Int'l. Journal for Numerical Methods in Fluids* 40, pp. 63-78.
Gai, X., et al., (2005), "A Timestepping Scheme for Coupled Reservoir Flow and Geomechanics in Nonmatching Grids", SPE 97054, 2005 *SPE Annual Tech. Conf. and Exh.*, pp. 1-11.
Haas, A., et al., (1994), "Geostatistical Inversion—A Sequential Method of Stochastic Reservoir Modeling Constrained by Seismic Data," *First Break* 12, 561-569 (1994).
Haugen, K. B., et al., (2013), "Highly Optimized Phase Equilibrium Calculations", *SPE* 163583, pp. 1-9.
Holden, L. et al. (1992), "A Tensor Estimator for the Homogenization of Absolute Permeability", *Transport in Porous Media* 8, pp. 37-46.
Isaaks, E. H., et al., (1989), "Applied Geostatistics", *Oxford University Press*, New York, pp. 40-65.
Kurzak, J., et al., (2007), "Implementation of Mixed Precision in Solving Systems of Linear Equations on the Cell Processor", *Concurrency Computat.: Pract. Exper.* 2007, vol. 19, pp. 1371-1385.
Journel, A., (1992), "Geostatistics: Roadblocks and Challenges," *Geostatistics, Troia '92: Quanititative Geoglogy and Geostatistics* 1, 213-224.
Klie, H., et al., (2005), "Krylov-Secant Methods for Accelerating the Solution of Fully Implicit Formulations", SPE 92863, 2005 *SPE Reservoir Simulation Symposium*, 9 pgs.
Mallat, S., (1999), "A Wavelet Tour of Signal Processing", *Academic Press*, San Diego, pp. 80-91.
Lu, B., et al., (2007), "Iteratively Coupled Reservoir Simulation for Multiphase Flow", SPE 110114, 2007 *SPE Annual Tech. Conf and Exh.*, pp. 1-9.
Mosqueda, G., et al., (2007), "Combined Implicit or Explicit Integration Steps for Hybrid Simulation", *Earthquake Engng. & Struct. Dyn.*, vol. 36(15), pp. 2325-2343.
Strebelle, S., (2002), "Conditional simulations of complex geological structures using multiple-point statistics," *Mathematical Geology* 34(1), 1-21.
Sweldens, W., (1998), "The Lifting Scheme: A Construction of Second Generation Wavelets," *SIAM Journal on Mathematical Analysis* 29, 511-546.
Qi, D. et al. (2001), "An Improved Global Upscaling Approach for Reservoir Simulation", *Petroleum Science and Technology* 19(7 &8), pp. 779-795.
Verly, G., (1991), "Sequential Gaussian Simulation: A Monte Carlo Approach for Generating Models of Porosity and Permeability," Special Publication No. 3 of EAPG—Florence 1991 Conference, Ed.: Spencer, A.M, 12 pgs.
Whitcombe, D. N., et al., (2002), "Extended elastic impedance for fluid and lithology prediction," *Geophysics* 67, 63-67.
White, C.D. et al. (1987), "Computing Absolute Transmissibility in the Presence of Fine-Scale Heterogeneity", SPE 16011, $9^{th}$ SPE Symposium in Reservoir Simulation, pp. 209-220.
Wu, X.H. et al. (2007), "Reservoir Modeling with Global Scaleup", SPE 105237, $15^{th}$ SPE Middle East Oil & Gas Show & Conf., 13 pgs.
Yao, T., et al., (2004), "Spectral Component Geologic Modeling: A New Technology for Integrating Seismic Information at the Correct Scale," Geostatistics Banff, *Quantitative Geology & Geostatistics* 14, pp. 23-33.
Younis, R.M., et al., (2009), "Adaptively-Localized-Continuation-Newton: Reservoir Simulation Nonlinear Solvers That Converge All the Time", SPE 119147, 2009 *SPE Reservoir Simulation Symposium*, pp. 1-21.mos.
Zhang T., et al., (2006), "Filter-based classification of training image patterns for spatial Simulation," *Mathematical Geology* 38, 63-80.
Antes, H. et al. (1992) "The Boundary Integral Approach to Static and Dynamic Contact Problems", Birkhauser Verlag, pp. 58-63, 76-84.
Levin, David (1998), "The approximation power of moving least squares", Mathematics of Computation, vol. 67, No. 224, pp. 1517-1531.
Rutten, K.W. et al. (2003) "Building and Unfaulting Fault-Horizon Networks", Geological Society, London, vol. 212, pp. 39-57.
Zhu, Y. et al. (2007) "3D Deformation Using Moving Least Squares", Harvard University Technical Report.

\* cited by examiner

METHODS TO HANDLE DISCONTINUITY IN CONSTRUCTING DESIGN SPACE USING MOVING LEAST SQUARES

This application claims the benefit of U.S. Provisional Patent Application 62/073,465, filed Oct. 31, 2014, entitled METHODS TO HANDLE DISCONTINUITY IN CONSTRUCTING DESIGN SPACE USING MOVING LEAST SQUARES, the entirety of which is incorporated by reference herein.

FIELD OF THE INVENTION

This disclosure relates generally to the field of hydrocarbon prospecting or reservoir management and, more particularly, to reservoir modeling and simulation. Specifically, the disclosure relates to a method for a gridless mapping from the actual discontinuous, i.e. faulted, subsurface domain to a continuous design domain where model parameter assignment and revision can most readily be performed. The populated subsurface model can then be mapped back to the physical domain and used, for example, for hydrocarbon operations, such as reservoir simulation studies in reservoir exploration, development or production stages, as well as for representing a geologic model description of a reservoir structure and material properties.

BACKGROUND

Faults, and the offset along them, result in discontinuities in geologic models. In geologic modeling, the properties of reservoir rock are typically modeled in a continuous depositional space, or design space. The present techniques provide an enhanced method and workflow to construct a continuous space (e.g., design space), by removing the discontinuities introduced by the faults. However, it should be noted that the present techniques are not a technique for reverse engineering of faulting events, a process known as "fault restoration" in structural geology. This distinction between the present techniques and "fault restoration" are addressed further below in this document.

Faults break up depositional strata by cutting across and offsetting them. As such, the depositional structures of a subsurface reservoir are also broken up. As geological concepts are often tied to distinct geological events and the resulting depositional structures, it is very hard to build a computer geologic model for a faulted subsurface reservoir. More specifically, the geological concepts that are used to describe the geology of a reservoir are constructed in continuous spaces, yet the actual geologic model lives in a discontinuous space. Thus, building a geologic model often requires applying a continuous concept to a discontinuous geologic model. This is very difficult and cumbersome. Moreover, as more data become available, the geologic model process often involves modifying the original geological concept or the structural framework. The structural framework is faults and horizons that define the geometry of the subsurface. Such modifications may require building the geologic model from scratch all over again. Therefore, it is desirable to remove the discontinuities and transform the faulted discontinuous region (e.g., physical space) into a continuous region (e.g., design space) where geological concepts can be easily applied and modified. After a satisfactory model has been built in the design space, the model can be transformed back to physical space. The present techniques provides a transformation method that is:

(1) Efficient: This process may be performed or run multiple times as new or updated data become available or the geologic interpretations are modified. Accordingly, it is beneficial if the algorithm is efficient when constructing the transformation. Furthermore, after the transformation is constructed, the mapping between physical space and design space using the transformation involves a large number of points. Thus, the mapping operation using the transformation also has to be efficient.

(2) Easy-to-use: The transformation method usually uses techniques found in mathematics, computer graphics, and/or other engineering disciplines which are not in the expertise of general geologic modelers. Although it is part of geologic modeling, it is not expected for a general geologic modeler to know the technological details of the transformation. Instead, it is desirable for the transformation method to be easily controlled by a minimum number of parameters that make geological sense to a modeler.

(3) Geologically plausible: With the transformation from physical space to design space, the majority of the modeling effort now occurs in design space. Accordingly, the resulting design space should be geologically plausible: meaning that the design should have minimum volumetric distortion comparing to the physical space.

Current Technology

Research in discontinuity removal due to faults and offsets are mainly driven by two applications. One is to understand the geologic faulting process and validate the geologic faulting structure as interpreted from seismic data. In this process, different parts of a geologic structural framework are reversed back to their original state before the faulting happened under certain mechanical or geometrical constrains. If a geologic interpretation can go through this process reasonably well (e.g., is consistent with what is geologically reasonable within a certain threshold) it is considered a plausible interpretation. The other application is as a method to construct design and/or depositional space for property population in geologic modeling.

Some recent publications and current commercial products include the following: U.S. Pat. No. 7,480,205 ("3D fast fault restoration") describes a solution to an elasticity equation for a displacement field on a mesh that conforms to the fault and horizon surfaces. For complicated faulting scenarios, it is very difficult to generate a mesh with reasonable quality to solve the equations. Furthermore, meshes with higher resolution will definitely have an adverse impact on computation efficiency.

U.S. Pat. No. 8,315,845 ("Method for building depositional space corresponding to a geological domain") describes using a similar approach by solving geomechanical equations on a conforming mesh. The depositional space is constructed by flattening one of the horizons (usually the top horizon) in the model and specifying that the two sides of the fault can only "slip" along the fault surface. This approach shares the same problems that may be foreseen with U.S. Pat. No. 7,480,205. In addition, it is designed to create an "isochron" space by flattening a horizon; while in the meantime, it introduces unnecessary deformation into the design space.

In addition, other conventional approaches, such as U.S. Pat. No. 6,106,561, describe a design space that is dependent upon the logical relations in an "IJK" indexing of the geologic cells, which may not give sufficient consideration to the actual geometries of the geologic framework, which in turn may cause volumetric distortions to be introduced in the design space.

As yet another approach, kinematic modeling may be performed. See, e.g., 3D Kinematic Modeling brochure 2014 and 2D Kinematic Modeling brochure 2014. Kinematic approaches are based on a set of geometric rules, such as conservation of length and cross sectional area. These rules are case dependent and require a significant amount of background in structural geology. In addition, they are mostly applicable in fault restoration of two-dimension (2D) cross sections and very difficult to use in three-dimension (3D). This set of approaches cannot be easily used in geologic modeling as it does not provide a point-to-point mapping between the physical space and design/depositional space.

Datuming approaches: the general idea of a datuming approach is to identify one of the horizons in the geologic framework as reference, and restore the horizon using some simple geometric operations, and the movement of the rest of the model is referenced to the movement on the reference horizon. An example of this approach is described in Rutten and Verschuren (2003). See Rutten, K. W. and Verschuren, M. A. J., "Building and Unfaulting Fault-Horizon Networks", *Geological Society, London*, Special Publications, V. 212, p. 39-57 (2003). This reference describes a piecewise linear function to define the slip vector on a fault trace. The movement for points away from the fault is attenuated by applying a simple decay function along a set of scan lines intersecting with the fault. The decay function may become difficult to define in practice in 3-D cases where the faulting scenario is complicated.

SUMMARY

The technical problem addressed by the present techniques involves constructing design space as an interpolation problem. The present techniques provide a systematic approach to find the matching relationship of the fault traces on the two sides of the faults, from which the location of the fault traces in the design space can be determined. The location of any other point in the design space may then be determined by interpolation of the locations of fault traces. This approach has the advantage of (1) not requiring a grid, (2) being highly efficient and easily parallelizable, and (3) introducing only minimal volumetric distortion. As used herein, the term "fault trace" means the intersection lines between a fault surface and the faulted horizon.

In one embodiment, a method for generating a model of a material property of a faulted subsurface region for hydrocarbon prospecting or reservoir development is described. The method comprising:
(a) mapping, using a computer, a model of the faulted subsurface region to a continuous design space in which all faults are removed, using a transformation $T_x$ that minimizes objective function (e.g., distance) between a set of transformed positions of the control point $p_i$ ($T_x(p_i)$) and a set of positions of the control points in the design space $q_i$ for i=at least 1 control point (e.g., i=1 to N, where N is a integer number greater than 2), where $p_i$ is position of the control point in the faulted subsurface region and $q_i$ is the position of the control point in the design space;
(b) assigning values of the material property in the design space to generate a model of the material property in the design space, and using the transformation $T_x$ to generate a model of the material property in the faulted subsurface region; and
(c) using the model of the material property in the faulted subsurface region for hydrocarbon prospecting or reservoir development.

In a preferred embodiment, the transformation $T_x$ is determined by moving least squares. For example, the transformation $T_x$ is determined as a transformation that minimizes $$E(x) = \sum_i w_i(x)|T_x(p_i) - q_i|^2$$

where weights $w_i(x)$ are defined by $$w_i(x) = d(p_i, x)^{-2\alpha}$$

where $d(p_i, x)$ is distance between point x and $p_i$, and $\alpha$ is a parameter controlling how strongly deformation produced by a fault is influenced by distant control points. In another example, the transformation $T_x$ is determined as a transformation that minimizes $$E(x) = \sum_i w_i(x)|T_x(p_i) - q_i|^2$$

where weights $w_i(x)$ are discontinuous functions that control how strongly deformation produced by a fault is influenced by far away control points.

BRIEF DESCRIPTION OF THE DRAWINGS

The advantages of the present invention are better understood by referring to the following detailed description and the attached drawings, in which:

FIGS. 1A and 1B are schematic diagrams illustrating the moving least squares method, where FIG. 1A shows the initial state (e.g., location of control points in the faulted subsurface region), and FIG. 1B shows the final state (e.g., location of the control points in the continuous design space);

DETAILED DESCRIPTION

In the following detailed description section, the specific embodiments of the present disclosure are described in connection with preferred embodiments. However, to the extent that the following description is specific to a particular embodiment or a particular use of the present disclosure, this is intended to be for exemplary purposes only and simply provides a description of the exemplary embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent.

The articles "the", "a" and "an" are not necessarily limited to mean only one, but rather are inclusive and open ended so as to include, optionally, multiple such elements.

As used herein, the term "hydrocarbons" are generally defined as molecules formed primarily of carbon and hydrogen atoms such as oil and natural gas. Hydrocarbons may also include other elements or compounds, such as, but not limited to, halogens, metallic elements, nitrogen, oxygen, sulfur, hydrogen sulfide ($H_2S$) and carbon dioxide ($CO_2$). Hydrocarbons may be produced from hydrocarbon reservoirs through wells penetrating a hydrocarbon containing formation. Hydrocarbons derived from a hydrocarbon reservoir may include, but are not limited to, petroleum, kerogen, bitumen, pyrobitumen, asphaltenes, tars, oils, natural gas, or combinations thereof. Hydrocarbons may be located within or adjacent to mineral matrices within the earth, termed reservoirs. Matrices may include, but are not limited to, sedimentary rock, sands, silicilytes, carbonates, diatomites, and other porous media.

As used herein, "hydrocarbon exploration" refers to any activity associated with determining the locations of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models and determining the likely locations for hydrocarbon reservoirs within the subsurface. The acquired measurement data may include seismic, gravity, magnetic, electromagnetic and the like.

As used herein, "hydrocarbon operations" refers to any activity associated with hydrocarbon exploration and/or hydrocarbon production.

As used herein, "hydrocarbon production" refers to any activity associated with extracting hydrocarbons from a well or other opening. Hydrocarbon production normally refers to any activity conducted in or on the well after the well is completed. Accordingly, hydrocarbon production or extraction includes not only primary hydrocarbon extraction but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

A realization of the present techniques is that a mathematical technique called "moving least squares" can be advantageously applied to the problem of constructing a model design space. In moving least squares, the user controls the deformation (from the physical domain to the design domain, which may also be referenced as design space) using a set of N control points. Let $p_i$ be the original position of the control point i ($1 \leq i \leq N$) and $q_i$ its deformed position of the control point associated with the respective p, (see FIGS. 1A and 1B). Given any point x in space, its position in the design space (e.g., deformed space) may be determined by solving a transformation $T_x$ that minimizes the following equation for the objective function E(x), as noted below:

$$E(x) = \sum_i w_i(x) |T_x(p_i) - q_i|^2$$

where weight $w_i(x)$ is a decaying function that tends to zero as the distance between $p_i$, which is the position of the control point, and point x becomes larger. For example, it may be defined by $w_i(x)=d(p_i, x)^{-2\alpha}$ or $w_i(x)=\exp(-d(p_i, x)^{-\alpha})$ or any other function that exhibits the above property, where $d(p_i, x)$ is the distance between point x and position of the control point $p_i$, and a is a parameter controlling how strongly the deformation is influenced by far away control points. From an intuitive standpoint, moving least squares may be thought of as trying to find a transformation $T_x$ (for each point x) such that under the transformation the control points $p_i$ is as close as possible to the preferred position of the control point $q_i$ in the design space. Persons who work in the technical field will be able to provide of alternative formulations of an objective function and a weight function that are at least roughly equivalent and accomplish the same purpose. All of these are within the scope of the present techniques.

Figure 1A:
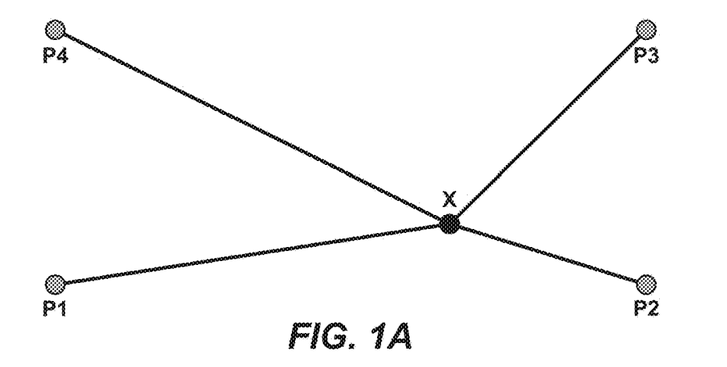

FIG. 1A is a schematic illustrating the moving least squares method. It shows an initial state system of five points. P1 through P4 are control points, and point x is a passive point whose movement is determined by the movements of the control points. The moving least squares method is an approach to determine the displacement of point x once the control points P1 through P4 are moved in space. The control points P1, P2, P3 and P4 that are closer to point x should have bigger influence on its movement. The lines in the diagram show the distance between point x and the control points P1, P2, P3 and P4.

Figure 1B:
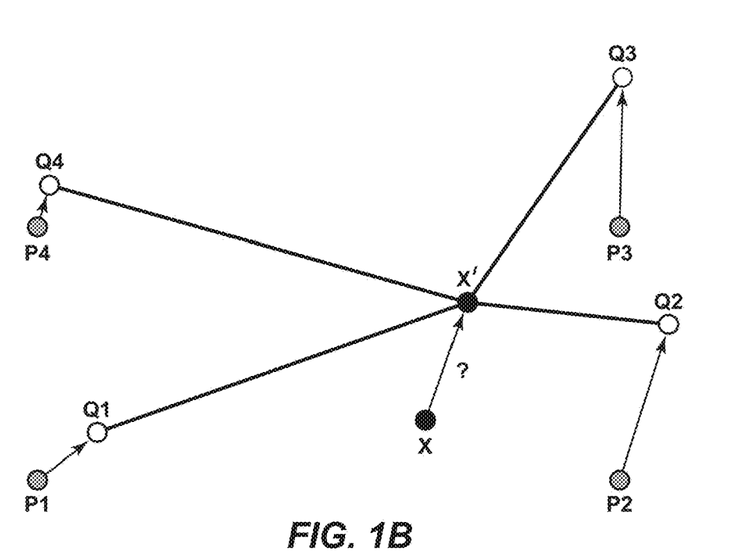

FIG. 1B is another schematic diagram showing the system of five points from FIG. 1A now in a final state. Control points P1 through P4 are moved to their new positions or locations Q1 through Q4. In applications of moving least squares, the new locations of the control points are known, like boundary conditions. Moving least squares (MLS) is used to determine the final location (x') of point x due to the movement of the control points. It ensures that the change is minimum (in the sense of least squares) for the relative spatial relation between point x and the control points.

The moving least squares method has found most of its previous applications in the computer graphics industry where it is used for constructing a surface from a set of points (Levin 1998). See Levin, David, "The approximation power of moving least squares," *Mathematics of Computation* 67, p. 1517-1531 (1998). Zhu and Gortler (2007) used moving least squares in computer animations where they created the animation of a 3D object by controlling a set of control points. See Zhu, Y. and Gortler, S. J., "3D Deformation Using Moving Least Squares", *Harvard University Technical Report*, TR-10-07 (2007). It should be noted that the selection of control points may be performed by a variety of approaches. One aspect of the present techniques is that it involves determining how to select the control points for the application of constructing design space for practical geologic scenarios.

In essence, the moving least squares method defines an algorithm for any point x in space to follow the movement of a set of control points (positioning of the control point $p_i$) in a way that is as rigid as possible (e.g., the algorithm tries to keep the change in the relative position between point x and position of the control points $p_i$ as small as possible after the position of the control points $p_i$ are moved to their corresponding new positions of control point $q_i$). It can easily be seen that moving least squares is a point-by-point mapping algorithm. The new position of a point is dependent only upon the starting and ending positions of the control points. Because it does not involve information of any other points, it does not rely on or involve a grid to do the calculation. For the same reason, the mapping of a large number of points can be easily parallelized and carried out very efficiently.

Figure 2:
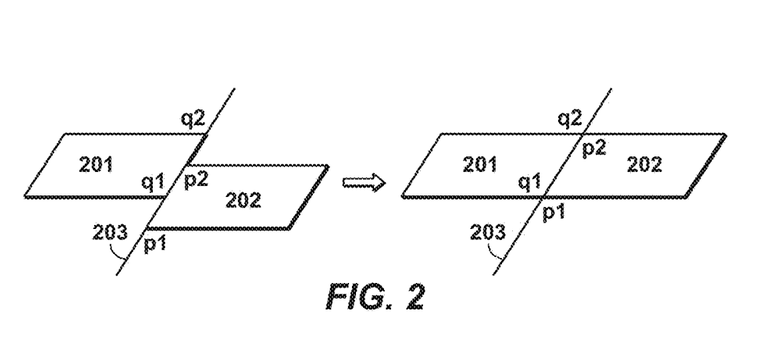
FIG. 2 is a simple illustration of construction of design space using moving least squares.

One approach to apply this technique to the model mapping problem is disclosed next in the form of work flows from which algorithms and the corresponding software can readily be generated. The workflows address the handling of discontinuities in constructing design space based on the moving least squares algorithm. This approach is described using a simple example, but may also be performed for more complicated applications. Referring to FIG. 2, which is a schematic diagram of a vertical cross-section of the subsurface, there are two blocks 201 and 202 and a fault surface 203. The two horizons of block 201 intersect the fault at positions of control points $q_1$ and $q_2$. Those of block 202 intersect at positions of control points $p_1$ and $p_2$. To remove the discontinuity due to the fault in this model, $p_1$ and $p_2$ may be defined as the position of respective control points, and they have to be moved to be co-located with respective position of the controls points $q_1$ and $q_2$ in design space. Here block 201 is taken as the reference block. The coordinates of any point in block 201 in design space are the same as in physical space. The position of any point in design space in block 202 is determined by the control points using the moving least squares algorithm.

Compared to other existing techniques, constructing design space using MLS has significant advantages. Many existing techniques require the solution of elasticity or geomechanics equations on a grid that conforms to the geologic framework using numerical methods such as finite element or boundary element.

Both the generation of the grid and the solution of the equations may be time-consuming and/or may be difficult to be made efficient. On the other hand, MLS is a point-by-point operation and thus does not require a grid, nor does it require the inversion of large scale linear systems. It can be easily parallelized and can be performed in an efficient manner. Gridless-based approaches tend to be either difficult to perform in practical 3D cases or tend to produce large distortions in the design space. The MLS method can mathematically ensure that the distortion introduced during this process is minimum in a least squares sense. It is also highly adaptable in dealing with complicated cases in 3D.

Control points are preferably points that are not together in the physical space because of the fault, but may have been co-located before the fault occurred, and hence should be co-located in the continuous design space. Readily identifiable control points are where a horizon (interface between two different layers) intersects the fault plane. Looking at FIG. 2, the interpreter knows to match the points $p_1$ and $q_1$ and the points $p_2$ and $q_2$, because the interpreter can readily recognize that blocks 201 and 202 are dislocated parts of the same layer. The transformation Tx that minimizes the dislocation of the control points in the design space is a technique for defining an optimal transformation. The moving least squares is an optimization technique that generates such an optimal transformation.

Figure 3:
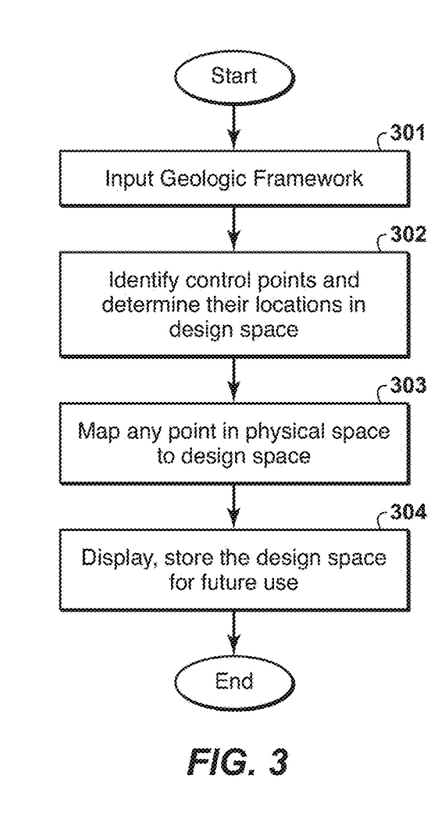
FIG. 3 is a flow chart showing basic steps in one embodiment of the present techniques.

A flow chart showing basic steps in one embodiment of the present techniques is given in FIG. 3. In step 301, the geologic framework is input. The geologic framework, which is a structural framework, includes horizons and faults associated with the subsurface region. The inputting of the geologic framework, which may be referred to as geologic model framework, may include inputting the geologic model framework by reading it into a computer or obtaining the geologic model framework from memory. Then in step 302, control points are identified and the location of the of the control points in the design space is determined. This step may include analyzing the geologic framework to determine control points and their locations in design space. In step 303, any point in the physical space is mapped to the design space. The mapping may be performed by the use of a method such as the MLS method. Finally, the design space may be displayed and/or stored for future use, as shown in block 304. For example, the design space may be visualized on a monitor or display unit and saved in memory.

At the center of the work flow are two steps: (1) Step 302: Identify the control points and determine their location in both physical and design space; and (2) Step 303: Use the moving least squares method to map any point from physical space to design space. The present techniques can be deceptively simple, because it is not straightforward to apply to real-world geologic models due to their geological/topological complexities.

Figure 4:
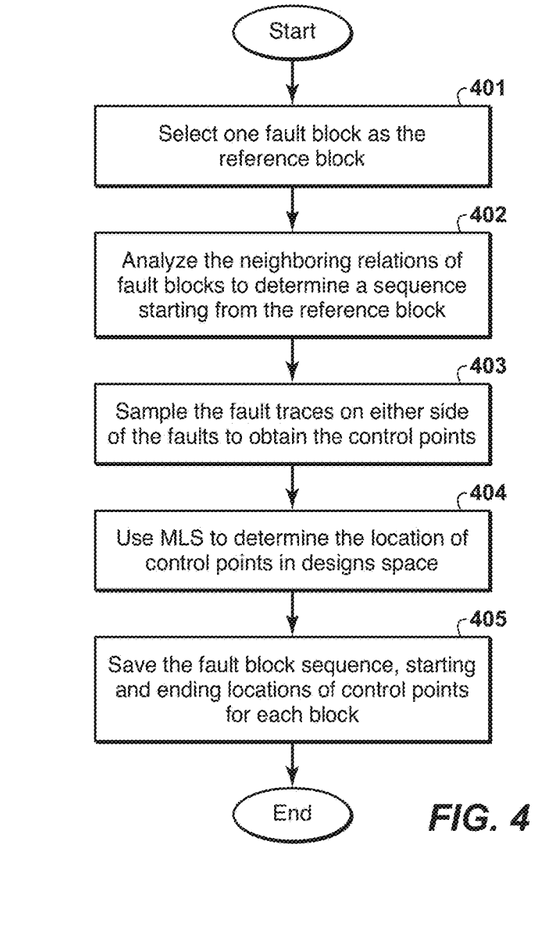
FIG. 4 is a flow chart showing basic steps for identifying and determining control points in physical and design spaces in one embodiment of the present techniques.

In one embodiment of the present techniques, step 302 uses a sequential unfaulting workflow. Here, it is assumed that the geologic framework in physical space can be decomposed into simple fault blocks—meaning that the faults can terminate only at the model boundary or another fault. It is also assumed that the fault intersects with all the horizons. Simple geometric editing can be done to extend the fault to the model boundary or another fault if there are faults terminating inside the model. FIG. 4 is a flow chart showing basic steps for performing step 302 in one embodiment of the present techniques.

Figure 5:
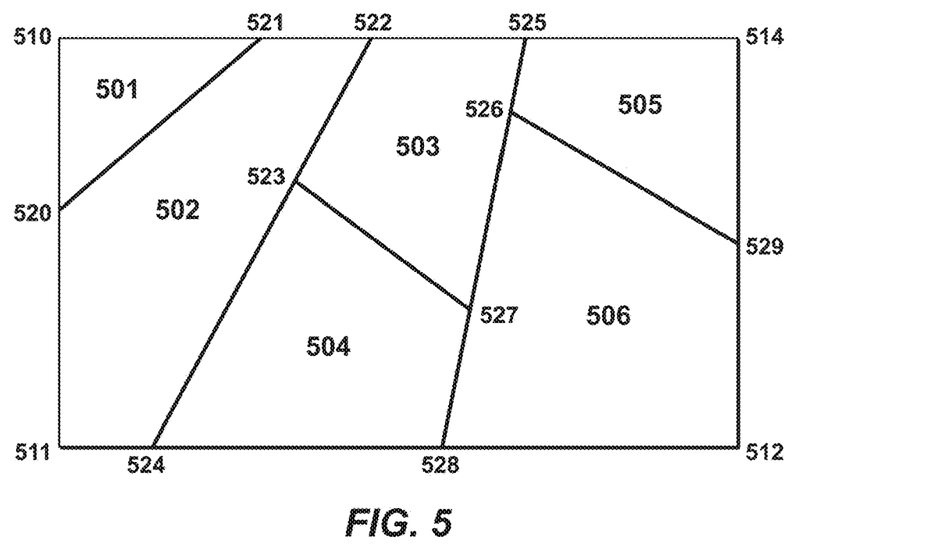
FIG. 5 shows an example of fault blocks in map view.

In step 401, one fault block is selected as the reference block. Because one of the objectives of the present techniques is to lessen or minimize the volumetric distortion between the physical space and the design space, the biggest block (e.g., largest volume or area) may typically be selected as the reference block as this ensures there is no distortion in this block. In step 402, the neighboring relations of fault blocks is analyzed to determine a sequence starting from the reference block. An example is given in FIG. 5. In this diagram, the nodes 510, 511, 512 and 513 define an outer boundary and nodes 520, 521, 522, 523, 524, 525, 526, 527, 528, and 529 are used for divide the space into various blocks, such as block 501, block 502, block 503, block 504, block 505 and block 506. Block 506 was selected as the reference block. The sequence next includes the neighboring blocks of the reference block and continues to include the neighbors of the neighboring blocks until all blocks are accounted for. As an example, the possible block sequence may be 506-505-503-504-502-501, for the respective blocks 501 to 506.

Figure 6:
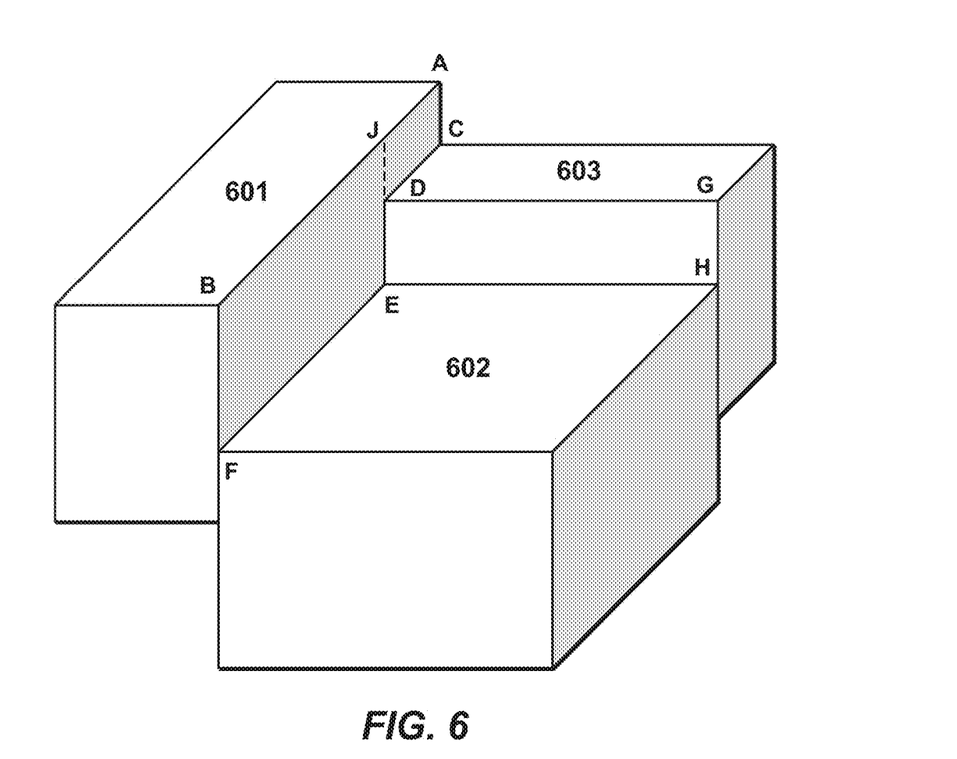
FIG. 6 shows a simple example of a geologic model in 3D in physical space.

In step 403, the fault traces on either side of the faults are sampled to obtain the control points. The sampling may include determining the location of the control points in physical space. Fault traces are defined as the intersection between faulted horizons and fault surfaces. To remove the discontinuity on a horizon due to a fault, the fault traces on the two sides a fault need to overlap in the design space. Thus, the fault traces are ideal regions to place the control points. It is preferred that the same number of sample points (e.g., control points) be obtained for any pair of segment traces. In other words, for every control point located on one of a fault trace pair, a corresponding point on the other fault trace of the pair should match up to the first control point in design space. This is illustrated through an example in FIG. 6. It can be easily seen from this model that fault trace pairs AJ and CD, BJ and FE, EH and DG should overlap in the design space to remove all the discontinuities introduced by the two faults. End points of the fault trace segments (e.g. A, B, C, D etc.) are usually readily identifiable and therefore logical points to sample. Note that point J on segment AB is not always readily available in common geologic models, but its position may be estimated. A computer algorithm may be developed to automatically determine this kind of intermediate point. This is necessary because even though AB is a continuous fault trace of block 1, it corresponds to two discontinuous segments CD and FE on the other side of the fault. It should be noted that the control points should be sampled on all the fault traces on all the horizons in the model. It is for simplicity of illustration that only those on the top horizon are indicated in FIG. 6 and in the description above.

Figure 7:
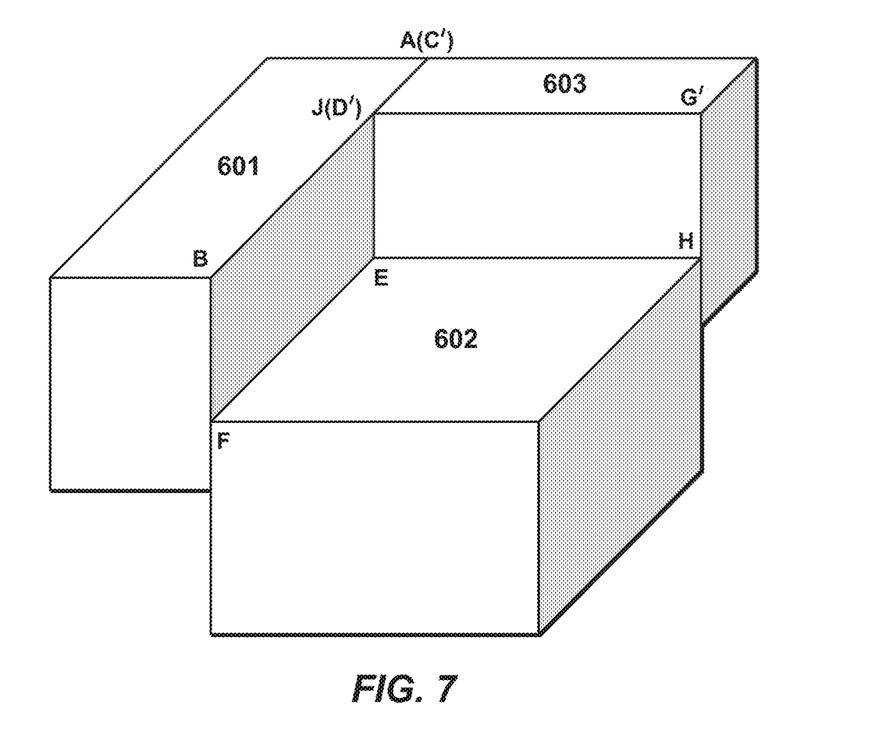
FIG. 7 shows the configuration of the model in FIG. 6 after removal of the discontinuity between blocks.
Figure 8:
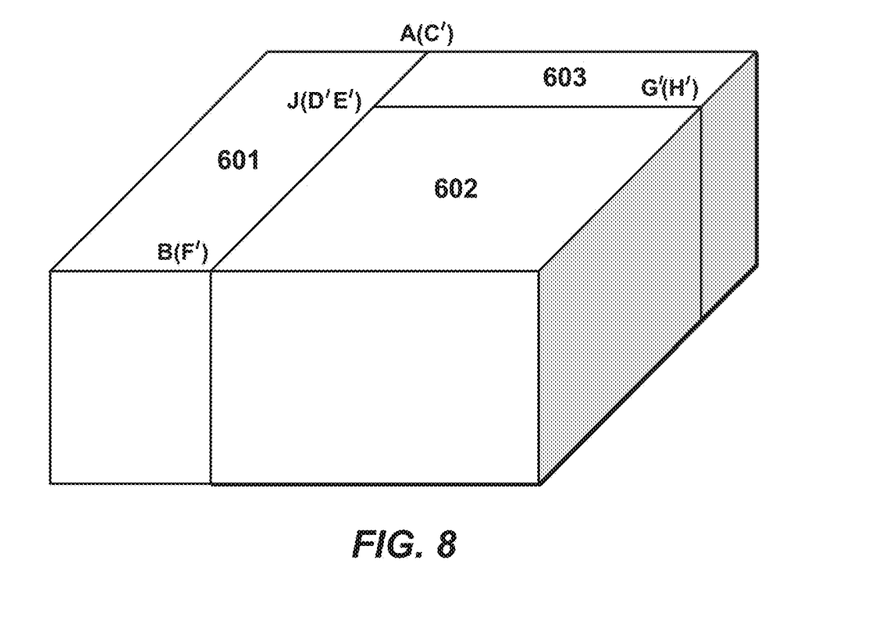
FIG. 8 shows the design space of the model in FIG. 6 after all the discontinuities are removed.

In step 404, the locations of the control points in the design space are determined using MLS. The use of the MLS may include determining block-by-block, sequentially following the sequence determined in step 401. Using the model in FIG. 6 as an example, and supposing block 601 is selected as the reference block, a possible block sequence is block 601-block 603-block 602. Obviously, because block 601 is the reference block, the control points in block 601 (e.g., the points sampled along fault traces AJ and BJ) may have the same coordinates in the design space as in the physical space. Furthermore, any point in block 601 may have the same coordinates in the design space. Block 603 may next be considered. The control points for block 603 are located along fault trace CD. With respect to the block 601, the target location of control points along CD should be along segment AJ in the design space (FIG. 7). This relation of control points in the physical space and the design space determines the mapping of any point inside block 603 from physical space to design space. Particularly, because of the mapping of block 603, the points located on fault trace DG may have new locations along D'G' in design space. These new locations may be determined by MLS as well using CD as control points and AJ as the target of the control points. In the example of FIGS. 6 and 7, where the fault blocks are shown as regular rectangular blocks, the mapping may not need MLS, but this is merely exemplary. Next, for block 602, its control points are located along FE and EH in the physical space. Their target locations in the design space should be BJ and D'G'. The movement of any point inside block 602 in the design space are determined by these control points and their target locations. FIG. 8 is an illustration of the resulting final design space for this model.

Generally speaking, for each block after the reference, the sampled points along the fault traces for this block are divided into two groups. One group includes all the points that have corresponding points in all the previous blocks that have already been mapped; these are the control points for the movement of this block. The other group includes all the other sampled points that have to be mapped to the design space using MLS, and may be used as the target locations of control points for the following blocks. For a practical model with multiple fault blocks, such as the one illustrated in FIG. 5, the workflow described above become a recursive process as the coordinates of control points in design space are calculated following the block sequence determined in step 402. Proper data structure and algorithm design may be used to automate this process for complicated practical cases.

In step 405, the fault block sequence, starting and ending locations of control points for each block may be saved. The fault block sequence, and the coordinates of the control points in physical and design spaces for each block may be written into a file and saved in memory of a computer. It should be noted that this is also one of the advantages of MLS in that it involves less memory (e.g., requires very little disk space) to record all the information needed to construct the design space for a geologic framework.

Figure 9:
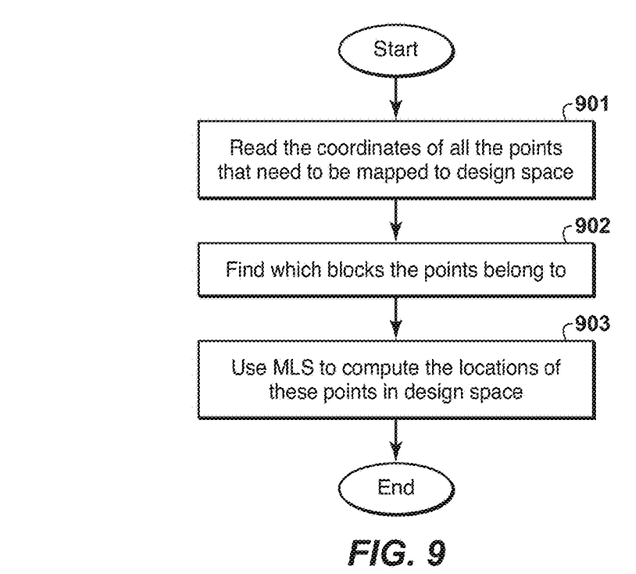
FIG. 9 is a flow chart showing basic steps for mapping any point in physical space to design space using moving least squares.

FIG. 9 is a flow chart showing basic steps for performing step 303 (mapping any point from physical space to design space) in one embodiment of the present techniques. In step 901, the coordinates of all points that need to be mapped to design space are read. This step may include obtaining the coordinates from memory and providing the coordinates from memory to a processor to perform a computer program. Then, in step 902, the blocks the points belong to are found. The finding of the blocks associated with the points may be obtained from information in memory or other suitable sources. This information may be provided to the computer as input data to the mapping program; alternatively, the code may be written to automatically figure out this information. Once the belonging block information descriptor (ID), which is any descriptor for the block, is known, moving least squares can be used to map this point to design space using the control points for this block. Accordingly, in step 903, the locations of these points in design space are computed using MLS.

From the steps outlined above, it can be seen that the root reason why the geologic framework is involved in some embodiments of the present techniques to consist of simple fault blocks is that it is necessary to know the block ID of a point to properly choose the right set of control points for the moving least squares calculation. In fact, there are a lot of geologic models that do not satisfy this requirement. A preprocessing step can solve this problem by extending the faults such that they end at another fault or model boundary, but it may not always be feasible if the number of faults is large and their relations are complicated. Another embodiment of the present techniques can overcome this requirement.

Figure 10:
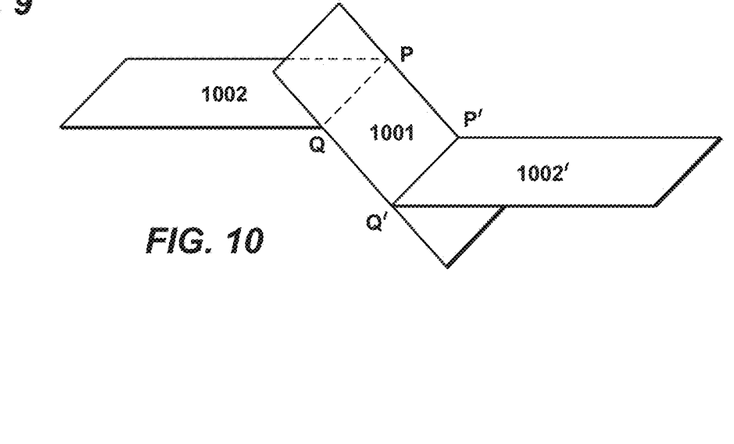
FIG. 10 is a schematic diagram of a fault surface intersecting a dislocated horizon.

Referring to FIG. 10, fault surface 1001 cuts through a horizon and separate it into two pieces 1002 and 1002' on the two sides of the fault. This results in two intersection lines QP and Q'P' that are associated with the two horizon segments of the pieces 1002 and 1002' on the two sides of the fault. The lines QP and Q'P' are the fault traces.

Recalling the minimization problem, $E(x)=\Sigma_i w_i(x)|T_x(p_i)-q_i|^2$, in the context of constructing design space, $p_i$ is the location of fault traces in physical space, and $q_i$ is their location in design space. If a point cannot be identified as being in a particular block or segment, then all of the points may be used in the computation with a weight function. In this example, the weight function $w_i(x)$ can be redefined as a discontinuous function, such that if point x and $p_i$ appear on two sides of any fault, $w_i(x)=0$. Therefore, the problem of determining the block ID for a point becomes the search of a discontinuous weight function.

Figure 11:
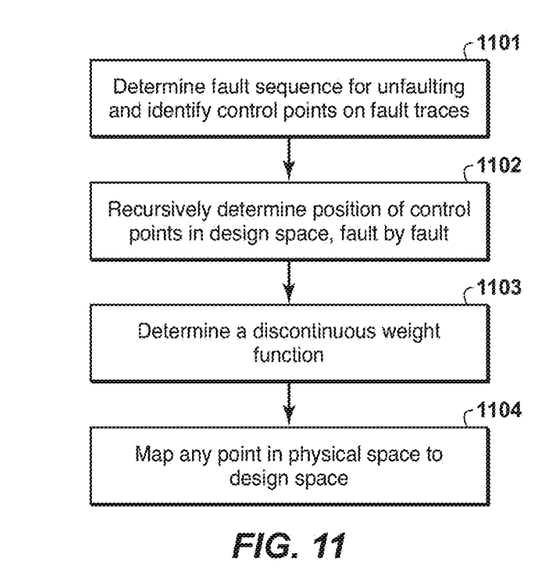
FIG. 11 is a flow chart showing basic steps in an embodiment of the present techniques method that uses a discontinuous weight function to address a geologic framework that does not consist of simple fault blocks.

The discontinuous weight function can be determined by many approaches. One of the approaches is to introduce the dipole concept used in boundary integral methods (Antes and Panagiotopoulos, 1992) and place dipoles on the fault surfaces. The dipole function naturally introduces a jump across the faults. See Antes, H. and Panagiotopoulos, P. D., *The Boundary Integral Approach to Static and Dynamic Contact Problems*, Birkhauser Verlag (1992); in particular, see section 2.5 (pages 53-63) and section 3.3 (pages 76-84). Basic steps for an example embodiment of the present techniques using the discontinuous weight function may be summarized as follows (see the flow chart of FIG. 11:

Step 1101: Determine fault sequence for unfaulting and identify control points on fault traces. This may involve identifying the control points in physical space as described in steps 401-403 in the FIG. 4 embodiment.

Step 1102: Recursively determine the position of control points in design space fault-by-fault. The order of the faults can be set arbitrarily. This step may be summarized as follows:

(a) For the first fault, use the points on both sides of the fault as control points in physical space, and set the midpoints between point pairs on the two sides of the fault as the corresponding points in design space. The moving least squares method is then used to calculate the new positions of all the points along all the other faults using these points as control points.

(b) For the next fault, the new positions of the points on this fault are used as control points in physical space, and their mid-points are set as the corresponding points in design space. Using this set of control points, the locations of all the points on all the other faults are calculated again using moving least squares.

(c) Loop through all the faults. The final positions of the points are the positions in the design space.

Step 1103: Determine a discontinuous weight function. The discontinuous weight function may be determined through the use of boundary element or dipole approaches.

Step 1104: Map any point in the physical space (e.g., model) to design space. Here, the block ID information is not needed. Instead, all the control points in the model are used to carry out a moving least squares calculation.

The enhanced subsurface model from the present techniques may be used to enhance hydrocarbon operations, such as hydrocarbon exploration and hydrocarbon production. For example, the hydrocarbon exploration operations involve any activity associated with determining the locations of hydrocarbons in subsurface regions. Hydrocarbon exploration involves activities conducted to obtain measurements through acquisitions of measured data associated with the subsurface formation and the associated modeling of the data to identify potential locations of hydrocarbon accumulations. Accordingly, hydrocarbon exploration includes acquiring measurement data, modeling of the measurement data to form subsurface models and determining the likely locations for hydrocarbon reservoirs within the subsurface. The measurement data may include seismic, gravity, magnetic, electromagnetic and the like.

Further, hydrocarbon production operations involve any activity associated with extracting hydrocarbons from a well or other opening. Hydrocarbon production involve activities conducted to form the well along with activities in or on the well after the well is completed. Accordingly, hydrocarbon production or extraction includes not only primary hydrocarbon extraction but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

The hydrocarbon operations are used to develop strategies. The strategies may be used to explore for hydrocarbons and/or to produce hydrocarbons. That is, based on the comparison, drilling of a well may be performed to provide access to the hydrocarbon accumulation. Further, the production may include installing or modifying a production facility for the production of hydrocarbons from the production intervals that provide access to the hydrocarbons in the subsurface formation. The production facility may include one or more units to process and manage the flow of production fluids, such as hydrocarbons and/or water, from the formation. To access the production intervals, the production facility may be coupled to a tree and various control valves via a control umbilical, production tubing for passing fluids from the tree to the production facility, control tubing for hydraulic or electrical devices, and a control cable for communicating with other devices within the wellbore. The strategy may adjust the well locations, fracture depths and patterns, etc.

Beneficially, this method provides an enhancement in the production and exploration of hydrocarbons. In particular, the method may be utilized to enhance hydrocarbon exploration and hydrocarbon production operations. In particular, the method may be utilized to enhance hydrocarbon exploration and hydrocarbon production operations by more accurately representing the subsurface region, reducing the time needed to build a geologic model, thus facilitating evaluation of multiple geological and operational scenarios, in order to optimize the development strategies.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "comparing", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.)).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming Additionally, the present invention is in no way limited to implementation in any specific operating system or environment.

Further, one or more embodiments may include methods that are performed by executing one or more sets of instructions to perform modeling enhancements in various stages. For example, the method may include executing one or more sets of instructions to perform comparisons between thresholds current statuses or indications along with transmitting data between modules, components and/or sensors.

As an example, a computer system may be utilized and configured to implement on or more of the present aspects. The computer system may include a processor; memory in communication with the processor; and a set of instructions stored on the memory and accessible by the processor, wherein the set of instructions, when executed, are configured to: map a model of the faulted subsurface region to a continuous design space in which all faults are removed, using a transformation $T_x$ that minimizes distance between $T_x(p_i)$ and $q_i$ for i=at least 1 control point, where p, is position of the control point in the faulted subsurface region and $q_i$ is position of the control point in the design space; assign values of the material property in the design space to generate a model of the material property in the design space, and using the transformation $T_x$ to generate a model of the material property in the faulted subsurface region; and use the model of the material property in the faulted subsurface region for hydrocarbon prospecting or reservoir development. The set of instructions may also be configured to: determine a fault block sequence for unfaulting based on relationships between neighboring blocks, after arbitrarily selecting a control block; identify the control points, located on fault traces of seismic data records from the subsurface region, said fault traces being data traces on either side of a fault; determine the position of control points in the design space, block-by-block, according to the fault block sequence, in a recursive process; and map a point in the model to the design space, using control points from the fault block to which the point belongs, and repeating for a plurality of points until the model has been mapped to the design space. Further, the set of instructions may be configured to: starting from the control block, determine position of control points in design space for a neighboring block, being the next block in the fault block sequence, wherein control points across a common fault boundary in the control block are used for the common fault boundary, and the position in design space for control points along a common fault boundary with a third block in the sequence is determined by the moving least squares method using the control points across a common fault boundary in the control block; extend the recursive process to the third block in the sequence, and subsequently, one by one, to all blocks in the sequence, using previously established control point locations in the design space for at least one fault boundary, and use the moving least squares method to locate control points along a yet unprocessed fault boundary. Moreover, the set of instructions may be configured to determine a fault sequence for unfaulting, selecting a control fault that is the first fault in the sequence; identify the control points, located on fault traces of seismic data records from the subsurface region, said fault traces being data traces on either side of a fault; determine the position of control points in the design space fault-by-fault, according to the fault sequence, in a recursive process; determine a discontinuous weight function; and map a point in the model to the design space, using all the control points in the model, subject to operation of the discontinuous weight function, to carry out the moving least squares calculation, and repeating for a plurality of points until the model has been mapped to the design space.

Figure 12:
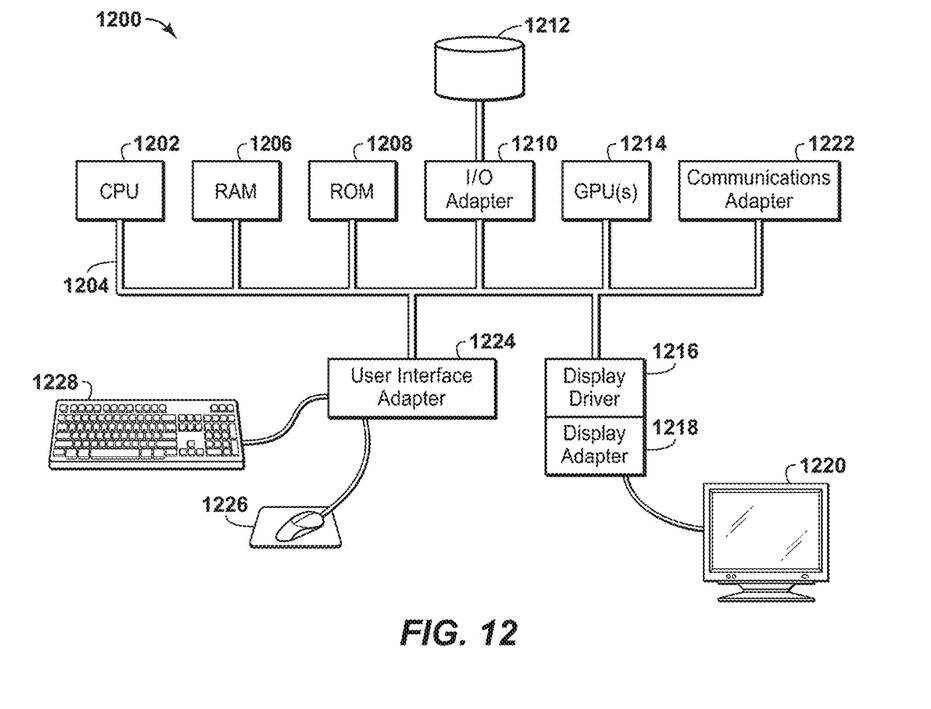
FIG. 12 is a block diagram of a computer system that may be used to perform any of the methods disclosed herein.

As an example, FIG. 12 is a block diagram of a computer system 1200 that may be used to perform any of the methods disclosed herein. A central processing unit (CPU) 1202 is coupled to system bus 1204. The CPU 1202 may be any general-purpose CPU, although other types of architectures of CPU 1202 (or other components of exemplary system 1200) may be used as long as CPU 1202 (and other components of system 1200) supports the present techniques as described herein. The CPU 1202 may execute the various logical instructions according to disclosed aspects and methodologies. For example, the CPU 1202 may execute machine-level instructions for performing processing according to aspects and methodologies disclosed herein.

The computer system 1200 may also include computer components such as a random access memory (RAM) 1206, which may be SRAM, DRAM, SDRAM, or the like. The computer system 1200 may also include read-only memory (ROM) 1208, which may be PROM, EPROM, EEPROM, or the like. RAM 1206 and ROM 1208 hold user and system data and programs, as is known in the art. The computer system 1200 may also include an input/output (I/O) adapter 1210, a communications adapter 1222, a user interface adapter 1224, and a display adapter 1218. The I/O adapter 1210, the user interface adapter 1224, and/or communications adapter 1222 may, in certain aspects and techniques, enable a user to interact with computer system 1200 to input information.

The I/O adapter 1210 preferably connects a storage device(s) 1212, such as one or more of hard drive, compact disc (CD) drive, floppy disk drive, tape drive, etc. to computer system 1200. The storage device(s) may be used when RAM 1206 is insufficient for the memory requirements associated with storing data for operations of embodiments of the present techniques. The data storage of the computer system 1200 may be used for storing information and/or other data used or generated as disclosed herein. The communications adapter 1222 may couple the computer system 1200 to a network (not shown), which may enable information to be input to and/or output from system 1200 via the network (for example, a wide-area network, a local-area network, a wireless network, any combination of the foregoing). User interface adapter 1224 couples user input devices, such as a keyboard 1228, a pointing device 1226, and the like, to computer system 1200. The display adapter 1218 is driven by the CPU 1202 to control, through a display driver 1216, the display on a display device 1220. Information and/or representations of one or more 2D canvases and one or more 3D windows may be displayed, according to disclosed aspects and methodologies.

The architecture of system 1200 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

In one or more embodiments, the method may be implemented in machine-readable logic, such that a set of instructions or code that, when executed, performs operations from memory. The set of instructions may be configured to: map a model of the faulted subsurface region to a continuous design space in which all faults are removed, using a transformation $T_x$ that minimizes distance between $T_x(p_i)$ and $q_i$ for i=at least 1 control point, where $p_i$ is position of the control point in the faulted subsurface region and $q_i$ is position of the control point in the design space; assign values of the material property in the design space to generate a model of the material property in the design space, and using the transformation $T_x$ to generate a model of the material property in the faulted subsurface region; and use the model of the material property in the faulted subsurface region for hydrocarbon operations. The set of instructions may also include determining the transformation $T_x$ by moving least squares, which may include determining a transformation that minimizes $$E(x) = \sum_i w_i(x)|T_x(p_i) - q_i|^2$$

where weights $w_i(x)$ are defined by $$w_i(x) = d(p_i, x)^{-2\alpha}$$

where $d(p_i, x)$ is distance between point x and $p_i$, and $\alpha$ is a parameter controlling how strongly deformation produced by a fault is influenced by distant control points. Further, the set of instructions may be configured to decompose a geologic structural framework into simple fault blocks, meaning that a fault can terminate only at a boundary of the model or at another fault, and the mapping proceeds by a sequential unfaulting approach, which may include instructions configured to: determine a fault block sequence for unfaulting based on relationships between neighboring blocks, after arbitrarily selecting a control block; identify the control points, located on fault traces of seismic data records from the subsurface region, said fault traces being data traces on either side of a fault; determine the position of control points in the design space, block-by-block, according to the fault block sequence, in a recursive process; and map a point in the model to the design space, using control points from the fault block to which the point belongs, and repeating for a plurality of points until the model has been mapped to the design space. Moreover, the set of instructions are configured to: perform a recursive process that involves: starting from the control block, determining position of control points in design space for a neighboring block, being the next block in the fault block sequence, wherein control points across a common fault boundary in the control block are used for the common fault boundary, and the position in design space for control points along a common fault boundary with a third block in the sequence is determined by the moving least squares method using the control points across a common fault boundary in the control block; extending the recursive process to the third block in the sequence, and subsequently, one by one, to all blocks in the sequence, using previously established control point locations in the design space for at least one fault boundary, and using the moving least squares method to locate control points along a yet unprocessed fault boundary.

In other embodiments, the set of instructions may be configured to map uses moving least squares with a discontinuous weight function for a faulted subsurface region that has a geologic structural framework that cannot be decomposed into simple fault blocks, the term simple fault blocks meaning that a fault can terminate only at a boundary of the model or at another fault. In addition, the set of instructions may be configured to determine a transformation $T_x$ as a transformation that minimizes $$E(x) = \sum_i w_i(x)|T_x(p_i) - q_i|^2$$

where weights $w_i(x)$ are discontinuous functions that control how strongly deformation produced by a fault is influenced by far away control points. The discontinuous weight functions $w_i(x)$ are defined such that if point x and $p_i$ appear on two sides of any fault, $w_i(x)=0$ or are implemented by inducing a jump across faults by introducing dipoles on fault surfaces.

Further, the set of instructions may be configured to: determine a fault sequence for unfaulting, selecting a control fault that is the first fault in the sequence; identify the control points, located on fault traces of seismic data records from the subsurface region, said fault traces being data traces on either side of a fault; determine the position of control points in the design space fault-by-fault, according to the fault sequence, in a recursive process; determine a discontinuous weight function; and map a point in the model to the design space, using all the control points in the model, subject to operation of the discontinuous weight function, to carry out the moving least squares calculation, and repeating for a plurality of points until the model has been mapped to the design space.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other.

The foregoing description is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined by the appended claims.

The invention claimed is:

1. A method for generating a model of a material property of a faulted subsurface region for hydrocarbon prospecting or reservoir development, said method comprising:
   mapping, using a computer, a model of the faulted subsurface region to a continuous design space in which all faults are removed, wherein the mapping comprises:
      identifying a position of at least one control point in the faulted subsurface region, $p_i$;
      determining a position, $q_i$, of at least one control point in the design space using a transformation $T_x$ that minimizes distance between transformed positions $T_x(p_i)$ of the control point $p_i$ and the control point $q_i$ for i=at least 1 control point,
      wherein the control points are selected in pairs, $p_i$ and $q_i$, being points at a fault plane that were co-located before the fault but now are dislocated because of the fault;
      wherein the transformation $T_x$ is determined by moving least squares, and
      wherein the transformation $T_x$ is determined as a transformation that minimizes:

$$E(x) = \sum_i w_i(x)|T_x(p_i) - q_i|^2$$

where weights $w_i(x)$ are defined by $$w_i(x) = d(p_i, x)^{-2\alpha}$$

where $d(p_i, x)$ is the distance between x and $p_i$, and where $\alpha$ is a parameter controlling how strongly deformation produced by a fault is influenced by distant control points;
   assigning values of the material property in the continuous design space to generate a model of the material property in the design space; and
   using the transformation $T_x$ to generate a model of the material property in the faulted subsurface region; and
   using the model of the material property in the faulted subsurface region for hydrocarbon prospecting or reservoir development.

2. The method of claim 1, wherein the faulted subsurface region has a geologic structural framework that can be decomposed into simple fault blocks, meaning that a fault can terminate only at a boundary of the model or at another fault, and the mapping proceeds by a sequential unfaulting approach that comprises:
   determining a fault block sequence for unfaulting based on relationships between neighboring blocks, after arbitrarily selecting a control block;
   identifying the control points, located on fault traces of seismic data records from the subsurface region, said fault traces being data traces on either side of a fault;
   determining the position of control points in the design space, block-by-block, according to the fault block sequence, in a recursive process, wherein the recursive process comprises:
      starting from the control block, determining position of control points in design space for a neighboring block, being the next block in the fault block sequence, wherein control points across a common fault boundary in the control block are used for the common fault boundary, and the position in design space for control points along a common fault boundary with a third block in the sequence is determined by the moving least squares method using the control points across a common fault boundary in the control block; and
      extending the recursive process to the third block in the sequence, and subsequently, one by one, to all blocks in the sequence, using previously established control point locations in the design space for at least one fault boundary, and using the moving least squares method to locate control points along a yet unprocessed fault boundary; and
   mapping a point in the model to the design space, using control points from the fault block to which the point belongs, and repeating for a plurality of points until the model has been mapped to the design space.

3. The method of claim 2, wherein moving least squares is used for the mapping a point in the model to the design space.

4. A method for generating a model of a material property of a faulted subsurface region, the method comprising:
   mapping, using a computer, a model of the faulted subsurface region to a continuous design space in which all faults are removed using a transformation $T_x$ that minimizes distance between transformed positions $T_x(p_i)$ and $q_i$ for i=at least 1 control point, where $p_i$ is the position of the control point in the faulted subsurface region and $q_i$ is the position of the control point in the design space;
   assigning values of the material property in the design space to generate a model of the material property in the design space;
   using the transformation $T_x$ to generate a model of the material property in the faulted subsurface region; and
   outputting the model of the material property in the faulted subsurface region;
   wherein the control points are selected in pairs, $p_i$ and $q_i$, being points at a fault plane that were co-located before the fault but now are dislocated because of the fault;
   wherein the mapping uses moving least squares with a discontinuous weight function for a faulted subsurface region that has a geologic structural framework that cannot be decomposed into simple fault blocks, said term simple fault blocks meaning that a fault can terminate only at a boundary of the model or at another fault; and
   wherein the transformation $T_x$ is determined as a transformation that minimizes $$E(x) = \sum_i w_i(x)|T_x(p_i) - q_i|^2$$

where weights $w_i(x)$ are discontinuous functions that control how strongly deformation produced by a fault is influenced by far away control points.

5. The method of claim 4, wherein the discontinuous weight functions $w_i(x)$ are defined such that if point x and $p_i$ appear on two sides of any fault, $w_i(x)=0$.

6. The method of claim 4, wherein the mapping proceeds by a sequential unfaulting approach that comprises:
   determining a fault sequence for unfaulting, selecting a control fault that is the first fault in the sequence;
   identifying the control points, located on fault traces of seismic data records from the subsurface region, said fault traces being data traces on either side of a fault;
   determining the position of control points in the design space fault-by-fault, according to the fault sequence, in a recursive process;
   determining a discontinuous weight function; and
   mapping a point in the model to the design space, using all the control points in the model, subject to operation of the discontinuous weight function, to carry out the moving least squares calculation, and repeating for a plurality of points until the model has been mapped to the design space.

7. The method of claim 4, comprising:
   using the model with the one or more material properties for hydrocarbon operations.

\* \* \* \* \*